United States Patent
Nagata

(10) Patent No.: US 10,866,265 B2
(45) Date of Patent: Dec. 15, 2020

(54) INSPECTION JIG

(71) Applicant: YOKOWO CO., LTD., Tokyo (JP)

(72) Inventor: Takahiro Nagata, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 16/144,134

(22) Filed: Sep. 27, 2018

(65) Prior Publication Data
US 2019/0187181 A1 Jun. 20, 2019

(30) Foreign Application Priority Data

Dec. 18, 2017 (JP) ................... 2017-241390

(51) Int. Cl.
*G01R 1/073* (2006.01)
*G01R 3/00* (2006.01)
*G01R 1/067* (2006.01)
*G01R 31/28* (2006.01)

(52) U.S. Cl.
CPC ....... *G01R 1/0735* (2013.01); *G01R 1/06772* (2013.01); *G01R 1/07314* (2013.01); *G01R 3/00* (2013.01); *G01R 31/2808* (2013.01); *G01R 31/2889* (2013.01)

(58) Field of Classification Search
CPC ....... G01R 1/00; H01L 21/00; H01L 2221/00; H01R 3/00; H01R 2101/00
See application file for complete search history.

(56) References Cited

U.S. PATENT DOCUMENTS

| 4,548,451 A * | 10/1985 | Benarr ................ H01R 12/714 29/848 |
| 2002/0123271 A1* | 9/2002 | Henry ................ H01R 13/2421 439/700 |
| 2009/0026634 A1* | 1/2009 | Sakurai .................. H01L 24/14 257/778 |
| 2010/0283069 A1* | 11/2010 | Rogers ............. H01L 31/02008 257/98 |
| 2011/0141426 A1* | 6/2011 | Okada ................... G02F 1/1362 349/150 |
| 2012/0181683 A1* | 7/2012 | Yamazaki ........... H01L 23/5387 257/704 |
| 2014/0256176 A1* | 9/2014 | Esquivel ............. H01R 12/716 439/492 |
| 2015/0204906 A1* | 7/2015 | Ku ......................... G01R 31/67 324/756.05 |
| 2016/0282386 A1* | 9/2016 | Nagata ............... G01R 1/06755 |

OTHER PUBLICATIONS

BiTS Workshop 2007 Archive (https://www.bitsworkshop.org/archive/archive2007/2007ht.pdf), Paper#2.

* cited by examiner

*Primary Examiner* — Jermele M Hollington
*Assistant Examiner* — Temilade S Rhodes-Vivour
(74) *Attorney, Agent, or Firm* — Morgan, Lewis & Bockius LLP

(57) ABSTRACT

The inspection jig includes a rigid substrate, a flexible substrate connected to the rigid substrate, a support for supporting a part of the flexible substrate in a state that the part of the flexible substrate is protruded with respect to the rigid substrate, and a stretchable contactor provided on a protruding portion of the flexible substrate.

18 Claims, 3 Drawing Sheets

1 INSPECTION JIG

COMPARATIVE EXAMPLE

COMPARATIVE EXAMPLE

INSPECTION JIG

TECHNICAL FIELD

The present invention relates to an inspection jig such as a probe card used for inspecting electrical characteristics of a semiconductor integrated circuit and the like.

BACKGROUND ART

In an inspection jig such as a probe card used for inspecting electrical characteristics of a semiconductor integrated circuit, a contactor including a spring probe is mounted on a rigid substrate directly.

PRIOR ART DOCUMENT

Non-Patent Document

Non-Patent Document 1: BiTS Workshop 2007 Archive (https: //www.bitsworkshop.org/archive/archive2007/2007ht.pdf), PAPER#2

SUMMARY OF INVENTION

Problems to be Solved by Invention

The present invention is an inspection jig that is capable of using a shorter contactor as compared with the related art.

Means for Solving Problems

An embodiment of the present invention provides an inspection jig. The inspection jig includes:
a rigid substrate;
a flexible substrate that is connected to the rigid substrate;
a support that supports a part of the flexible substrate in a state that the part of the flexible substrate is protruded with respect to the rigid substrate; and
a stretchable contactor that is provided on a protruding portion of the flexible substrate, the protruding portion being protruded with respect to the rigid substrate.
The contactor includes:
a contact housing; and
a spring probe that is supported on the contact housing, one end of the spring probe being in contact with a contact portion provided on the protruding portion.
The contactor may be an elastic body in which a conductive substance is blended.
The support may be fixed to the rigid substrate.
In the inspection jig, the flexible substrate may include an inclined portion between both end portions and the projecting portion thereof, and an electronic component provided on the flexible substrate may be disposed on the inclined portion.

DESCRIPTION OF EMBODIMENTS

Figure 1:
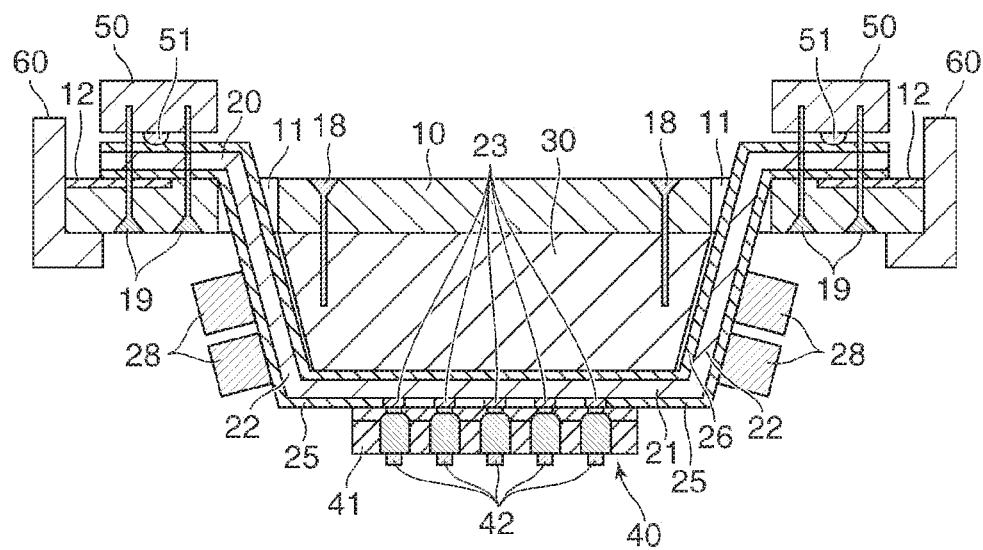
FIG. 1 is a schematic sectional view of an inspection jig 1 according to a first embodiment of the invention.

When a high frequency device is inspected, a contactor as short as possible is desired as it is necessary to transmit a high frequency signal. In a configuration in which a contactor is mounted on a rigid substrate directly, a contactor having a certain length or less is hardly to be used due to a mechanical constraint for attaching a probe card to an inspection device and a constraint on height of an electronic component mounted around the contactor.

The invention is an inspection jig that is capable of using a shorter contactor as compared with the related art.

Hereinafter, preferred embodiments of the invention are described in detail with reference to the drawings. The same or equivalent components, members, and the like illustrated in the drawings are denoted by the same reference numerals, and descriptions of these components are not repeated. The embodiments are not intended to limit the invention. All features and combinations of these features described in the embodiments are not necessarily essential to the invention.

First Embodiment

Figure 2:
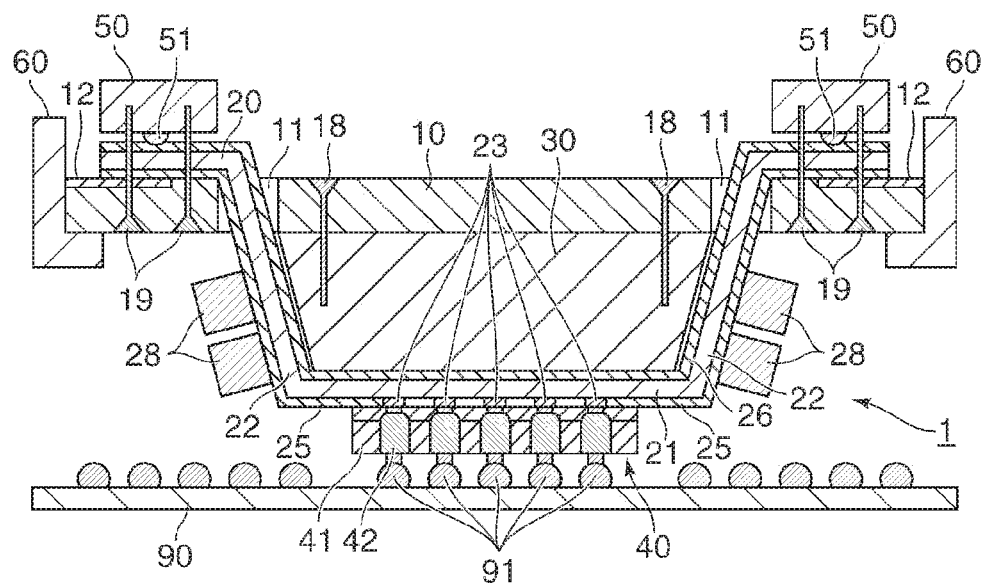
FIG. 2 is a schematic sectional view of a contactor 40 of the inspection jig 1 in contact with bumps 91 on a to-be-measured wafer 90.

FIG. 1 is a schematic sectional view of an inspection jig 1 according to a first embodiment of the invention. FIG. 2 is a schematic sectional view of a contactor 40 of the inspection jig 1 in contact with bumps 91 on a to-be-measured wafer 90. The upper-lower direction and the left-right direction orthogonal to each other in the inspection jig 1 are defined in FIG. 1. In FIG. 1, the vertical direction of the sheet refers to the upper-lower direction, and the horizontal direction thereof refers to the left-right direction. The direction perpendicular to the upper-lower direction and the left-right direction is defined as the front-rear direction. The inspection jig 1 is, for example, a probe card, and is used for inspecting electrical characteristics of a semiconductor integrated circuit in a wafer state. The inspection jig 1 includes a rigid substrate 10, a flexible substrate 20, a pedestal block 30 serving as a support, a contactor 40, a crimping block 50, and an attachment mechanism 60.

The rigid substrate 10 is made of a material that is less deformable than the flexible substrate to be described below. For example, the rigid substrate 10 is a glass epoxy substrate. The rigid substrate 10 extends perpendicularly with respect to the upper-lower direction. A pair of slit holes 11 penetrate the rigid substrate 10 vertically and extend in the front-rear direction on both left and right sides of the pedestal block 30. A high frequency line (high frequency conductive pattern) 12 for transmitting a high frequency signal is provided on an upper surface of the rigid substrate 10. Although not illustrated, the rigid substrate 10 is also provided with a low frequency line (low frequency conductive pattern) for transmitting a low frequency signal, a power supply line (power supply conductive pattern), and a ground line (ground conductive pattern).

The flexible substrate 20 is made of a deformable material. Both left and right end portions of the flexible substrate 20 are connected to the upper surface of the rigid substrate 10 by a pressing force of the crimping block 50. The flexible substrate 20 extends below the rigid substrate 10 through the slit holes 11. The flexible substrate 20 is protruded downward with respect to the rigid substrate 10 by a support of the pedestal block 30. The flexible substrate 20 includes a protruding portion 21 that protrudes downward with respect to the rigid substrate 10. A lower surface of the protruding portion 21 is a flat surface. The lower surface of the protruding portion 21 is provided with a plurality of contact pads 23 serving as contact portions. The contact pads 23 include contact pads for a high frequency signal, a low frequency signal, a power supply, and ground.

The flexible substrate 20 is provided with a high frequency line (high frequency conductive pattern) 25 on a lower surface thereof. The high frequency line 25 has one end thereof connected to a contact pad 23 for a high frequency and the other end connected to the high frequency line 12 of the rigid substrate 10. The flexible substrate 20 is provided with a ground line (ground conductive pattern) 26 on an upper surface thereof. The ground line 26 connects the ground line of the rigid substrate 10 and a contact pad 23 for ground to each other. The electrical connection between the upper surface and the lower surface of the flexible substrate 20 is performed via a through hole (not illustrated) when necessary. Although not illustrated, the flexible substrate 20 is provided with a low frequency line (low frequency conductive pattern) connecting the low frequency line of the rigid substrate 10 and a contact pad 23 for the low frequency signal, and a power supply line (power supply conductive pattern) connecting the power supply line of the rigid substrate 10 and a contact pad 23 for the power supply. The flexible substrate 20 includes an inclined portion 22 between the left and right end portions of the flexible substrate 20 and the protruding portion 21. A matching circuit mounted on the high frequency line 25 and an electronic component 28 (for example, a chip capacitor) connected between the power supply line and the ground line are provided on the inclined portion 22. The electronic component 28 is located above the contactor 40.

The pedestal block 30 is, for example, an insulating resin molded body. The pedestal block 30 is fixed to a lower surface of the rigid substrate 10 by a predetermined number of screws 18. The pedestal block 30 is located between the pair of slit holes 11 in the left-right direction. The pedestal block 30 has a four-sided pyramid shape having a substantially trapezoidal cross section perpendicular to the front-rear direction. The pedestal block 30 is configured to support the flexible substrate 20 with a part of the flexible substrate 20 being protruded downward with respect to the rigid substrate 10. The lower surface of the pedestal block 30 is a flat surface. An upper surface of the protruding portion 21 of the flexible substrate 20 is a flat surface. The upper surface of the protruding portion 21 may be in contact with a lower surface of the pedestal block 30.

The contactor 40 includes a contact housing 41 and a plurality of spring probes (contact probes) 42. The contact housing 41 is, for example, an insulating resin molded body. The contact housing 41 supports the spring probes 42 in an extendable and contractible manner. The contact housing 41 is fixed to the pedestal block 30 or the rigid substrate 10 by a screw and the like (not illustrated). Each of the spring probes 42 is a conductive metal such as copper or a copper alloy that extends in the upper-lower direction. The spring probes 42 include biasing means such as a coil spring (not illustrated). The spring probes 42 are extendable and contractible in the upper-lower direction. Upper ends of the spring probes 42 are in contact with the contact pads 23 provided on the lower surface of the protruding portion 21 of the flexible substrate 20. The upper ends of the spring probes 42 may also be in elastic contact with the contact pads 23. As illustrated in FIG. 2, lower ends of the spring probes 42 are in contact with the bumps 91 provided on the to-be-measured wafer 90. The lower ends of the spring probes 42 may also be in elastic contact with the bumps 91.

The pair of crimping blocks 50 is fixed to the upper surface of the rigid substrate 10 by a predetermined number of screws 19, so as to sandwich the left and right end portions of the flexible substrate 20 between the crimping blocks 50 and the upper surface of the rigid substrate 10. The crimping blocks 50 include elastic bodies 51 such as rubber on lower surfaces (surfaces on the rigid substrate 10 side) of the crimping blocks 50. The elastic bodies 51 are configured to press both the left and right end portions of the flexible substrate 20 to the upper surface of the rigid substrate 10 in an elastic manner. In this way, the high frequency line 12 provided on the upper surface of the rigid substrate 10 and the high frequency line 25 provided on the lower surface of the flexible substrate 20 are electrically connected to each other. Similarly, low frequency lines, power supply lines, and ground lines of the rigid substrate 10 and the flexible substrate 20 are also electrically connected to each other.

The attachment mechanism 60 is a well-known mechanism for supporting the rigid substrate 10 and attaching the inspection jig 1 to an inspection device (not illustrated). A detailed description thereof is omitted here. The attachment mechanism 60 is located above the contactor 40.

Figure 3:
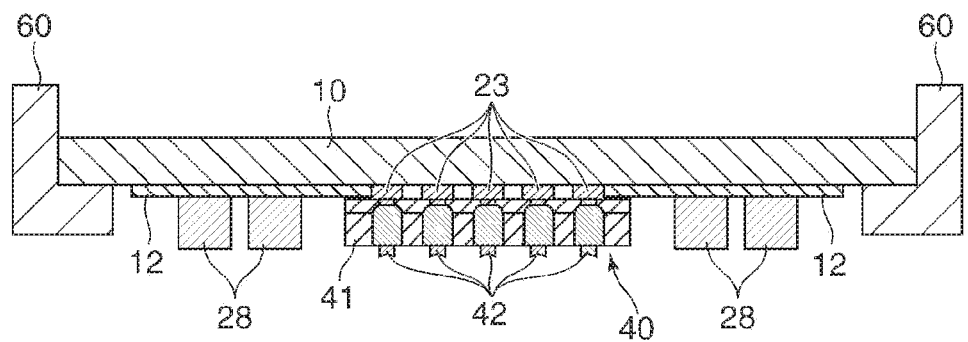
FIG. 3 is a schematic sectional view of an inspection jig according to a comparative example.
Figure 4:
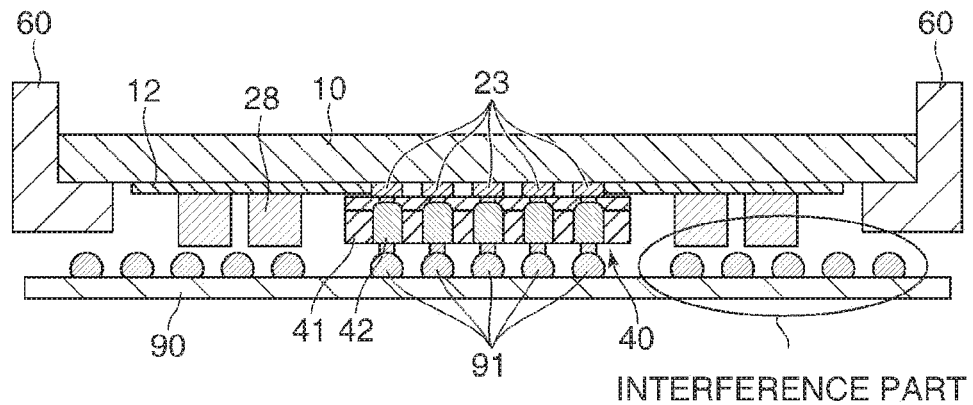
FIG. 4 is a schematic sectional view of the inspection jig according to the comparative example in contact with the bumps 91 on the to-be-measured wafer 90.

FIG. 3 is a schematic sectional view of an inspection jig according to a comparative example. FIG. 4 is a schematic sectional view of the inspection jig according to the comparative example in contact with the bumps 91 on the to-be-measured wafer 90. In the inspection jig according to the comparative example, the contactor 40 is mounted on the rigid substrate 10 directly. As is apparent from FIG. 4, the electronic component 28 and the attachment mechanism 60 interferes with the bumps 91 on the to-be-measured wafer 90 during inspection when the length of the contactor 40 in the upper-lower direction is shortened. Accordingly, the contactor 40 having a certain length or less cannot be used.

According to the embodiment, the following effects can be achieved.

(1) The electronic component 28 and the attachment mechanism 60 are less likely to interfere with the bumps 91 of the to-be-measured wafer 90 during inspection with the contactor 40 having a shorter length in the upper-lower direction, since the flexible substrate 20 is protruded downward with respect to the rigid substrate 10 by the pedestal block 30, the contactor 40 is mounted on the lower surface of the protruding portion 21, and the electronic component 28 is mounted on the inclined portion 22. Therefore, compared with the configuration in which the contactor 40 is directly mounted on the rigid substrate 10 as in the comparative example, the length of the contactor 40 can be shortened, which is advantageous for transmission of a high frequency signal.

(2) Since the pedestal block 30 is fixed to the rigid substrate 10 and the contactor 40 has elasticity, it is possible to suppress contact failure due to inclination of the pedestal block 30 with respect to the rigid substrate 10 as compared with a configuration in which the pedestal block 30 is biased downward with respect to the rigid substrate 10 by a spring and the like instead of being fixed thereto.

(3) Damage to the contact pads 23 can be suppressed since the contact pads 23 of the flexible substrate 20 are electrically connected via the contactor 40 instead of being in direct contact with the bumps 91 of the to-be-measured wafer 90. This is a great advantage since the entire flexible substrate 20 has to be replaced even if one contact pad 23 is damaged. Here, even if the spring probes 42 are damaged, it is possible to replace the damaged spring probes 42 only or replace the contactor 40. Accordingly, replacement time and the costs can be suppressed since it is unnecessary to replace the flexible substrate 20.

Second Embodiment

Figure 5:
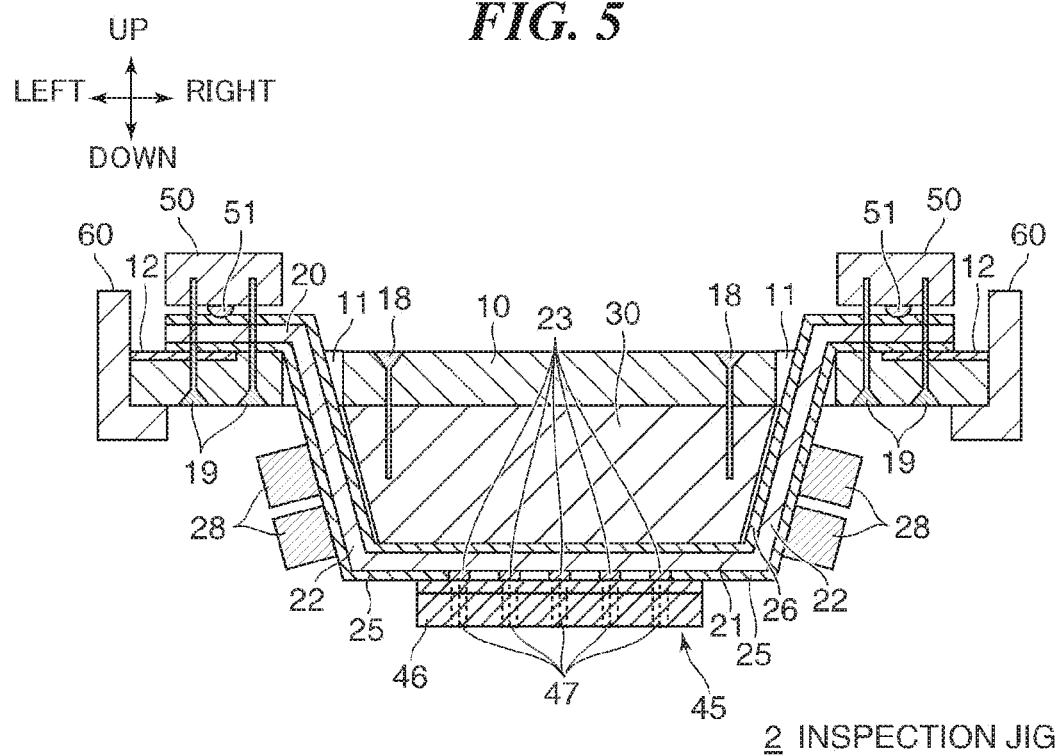
FIG. 5 is a schematic sectional view of an inspection jig 2 according to a second embodiment of the invention.
Figure 6:
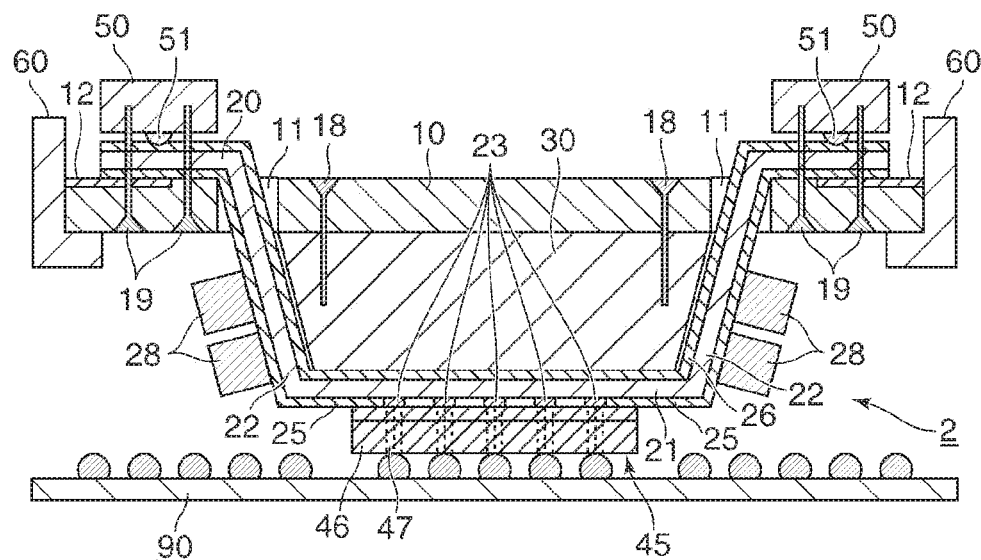
FIG. 6 is a schematic sectional view of a contactor 45 of the inspection jig 2 in contact with the bumps 91 on the to-be-measured wafer 90.

FIG. 5 is a schematic sectional view of an inspection jig 2 according to a second embodiment of the invention. FIG. 6 is a schematic sectional view of a contactor 45 of the inspection jig 2 in contact with the bumps 91 on the to-be-measured wafer 90. The inspection jig 2 in the embodiment is the same as the inspection jig 1 in the first embodiment except that the contactor 40 of the inspection jig 1 in the first embodiment is replaced with the contactor 45. The contactor 45 is, for example, a conductive rubber sheet. The contactor 45 is configured such that a conductive powder 47 such as a metal powder is blended (mixed) as a conductive material in a predetermined portion of an elastic body 46 such as rubber. The contactor 45 is capable of electrically connecting the contact pads 23 and the bumps 91 in a one-to-one manner as the spring probes 42 do (FIG. 1). The conductive powder 47 is blended in a predetermined portion of the elastic body 46, the predetermined portion being between the contact pads 23 and the bumps 91 of the to-be-measured wafer 90. The embodiment can also achieve the same effects as those in the first embodiment.

While the invention has been described with reference to the embodiments, it is obvious to those skilled in the art that various modifications may be made to constituent elements and processes in these embodiments within the scope of the claims.

According to the invention, it is possible to provide an inspection jig that is capable of using a shorter contactor as compared with the related art.

DESCRIPTION OF REFERENCE NUMERALS 1, 2 inspection jig (probe card)
10 rigid substrate
11 slit hole
12 high frequency line (high frequency conductive pattern)
18 screw
19 screw
20 flexible substrate
21 protruding portion
22 inclined portion
23 contact pad (contact portion)
25 high frequency line (high frequency conductive pattern)
26 ground line (ground conductive pattern)
28 electronic component
30 pedestal block (support)
40 contactor
41 contact housing
42 spring probe
45 contactor
46 elastic body
47 conductive powder
50 crimping block
51 elastic body
60 attachment mechanism
90 to-be-measured wafer (inspection object)
91 bump

The invention claimed is:

1. An inspection jig comprising:
a rigid substrate;
a flexible substrate that is connected to the rigid substrate;
a support that supports a part of the flexible substrate in a state that the part of the flexible substrate is protruded with respect to the rigid substrate; and
a stretchable contactor that is provided on a protruding portion of the flexible substrate, the protruding portion being protruded with respect to the rigid substrate,
wherein the rigid substrate includes a plurality of conductive patterns on at least one of upper and lower surfaces thereof, the plurality of conductive patterns including at least one of high frequency conductive pattern, low frequency conductive pattern, power supply conductive pattern, and ground conductive pattern.

2. The inspection jig according to claim 1, wherein the contactor includes:
a contact housing; and
a spring probe that is supported on the contact housing, one end of the spring probe being in contact with a contact portion provided on the protruding portion.

3. The inspection jig according to claim 1, wherein the contactor includes an elastic body in which a conductive substance is blended.

4. The inspection jig according to claim 1, wherein the support is fixed to the rigid substrate.

5. The inspection jig according to claim 1,
wherein the flexible substrate includes an inclined portion between both end portions and the protruding portion thereof, and
wherein an electronic component provided on the flexible substrate is disposed on the inclined portion.

6. The inspection jig according to claim 1,
wherein the flexible substrate is protruded on only one surface of the rigid substrate.

7. The inspection jig according to claim 1,
wherein the support includes a lower surface that is in contact with an upper surface of the protruding portion.

8. The inspection jig according to claim 2,
wherein the contact housing supports the spring probe in an extendable and contractible manner.

9. An inspection jig comprising:
a rigid substrate;
a flexible substrate that is more deformable than the rigid substrate, and includes two end portions that are connected to the rigid substrate;
a support that is arranged between the rigid substrate and the flexible substrate such that the flexible substrate is formed with a protruding portion with respect to the rigid substrate; and
a stretchable contactor that is provided on the protruding portion of the flexible substrate,.
wherein the rigid substrate includes a plurality of conductive patterns on at least one of upper and lower surfaces thereof, the plurality of conductive patterns including at least one of high frequency conductive pattern, low frequency conductive pattern, power supply conductive pattern, and ground conductive pattern.

10. The inspection jig according to claim 9, wherein the contactor includes:
a contact housing; and
a spring probe that is supported on the contact housing, one end of the spring probe being in contact with a contact portion provided on the protruding portion.

11. The inspection jig according to claim 9, wherein the contactor includes an elastic body in which a conductive substance is blended.

12. The inspection jig according to claim 9, wherein the support is fixed to the rigid substrate.

13. The inspection jig according to claim 9,
wherein the flexible substrate includes an inclined portion between both end portions and the protruding portion thereof, and
wherein an electronic component provided on the flexible substrate is disposed on the inclined portion.

14. The inspection jig according to claim 9,
wherein the rigid substrate includes at least a pair of slit holes through which the two end portions of the flexible substrate are connected to the rigid substrate.

15. The inspection jig according to claim 9,
wherein the rigid substrate includes a glass epoxy substrate.

16. The inspection jig according to claim 9, further comprising:
a pair of crimping blocks that are fixed to the rigid substrate and sandwich the two end portions of the flexible substrate between the crimping blocks and an upper surface of the rigid substrate.

17. The inspection jig according to claim 9,
wherein the protruding portion of the flexible substrate includes a lower surface that is provided with a plurality of contact pads.

18. The inspection jig according to claim 9,
wherein the support includes an insulating resin molded body.

\* \* \* \* \*